(12) United States Patent
Jung

(10) Patent No.: US 9,252,223 B2
(45) Date of Patent: Feb. 2, 2016

(54) SEMICONDUCTOR DEVICE HAVING A BURIED GATE

(71) Applicant: SK hynix Inc., Icheon (KR)

(72) Inventor: Tae O Jung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/531,778

(22) Filed: Nov. 3, 2014

(65) Prior Publication Data

US 2015/0061004 A1 Mar. 5, 2015

Related U.S. Application Data

(62) Division of application No. 13/651,161, filed on Oct. 12, 2012, now Pat. No. 8,900,967.

(30) Foreign Application Priority Data

Dec. 30, 2011 (KR) ........................ 10-2011-0147019

(51) Int. Cl.
| | |
|---|---|
| *H01L 29/66* | (2006.01) |
| *H01L 29/423* | (2006.01) |
| *H01L 27/02* | (2006.01) |
| *H01L 27/108* | (2006.01) |
| *H01L 21/762* | (2006.01) |
| *H01L 27/088* | (2006.01) |
| *H01L 29/06* | (2006.01) |

(52) U.S. Cl.
CPC ...... *H01L 29/4236* (2013.01); *H01L 21/76224* (2013.01); *H01L 27/0207* (2013.01); *H01L 27/088* (2013.01); *H01L 27/108* (2013.01); *H01L 27/10876* (2013.01); *H01L 27/10891* (2013.01); *H01L 29/0649* (2013.01)

(58) Field of Classification Search
CPC .............................. H01L 29/78; H01L 21/762
USPC ........................................................ 257/329
See application file for complete search history.

(56) References Cited

U.S. PATENT DOCUMENTS

| | | | |
|---|---|---|---|
| 2010/0155832 A1* | 6/2010 | Im ................................. | 257/330 |
| 2011/0147833 A1 | 6/2011 | Cho | |
| 2011/0156262 A1* | 6/2011 | Shin et al. ..................... | 257/773 |
| 2013/0168758 A1* | 7/2013 | Jung ............................. | 257/329 |

FOREIGN PATENT DOCUMENTS

| | | | |
|---|---|---|---|
| KR | 10-2002-0030492 A | | 4/2002 |
| KR | 20020030492 | * | 4/2002 |
| KR | 10-2011-0071352 A | | 6/2011 |

\* cited by examiner

*Primary Examiner* — Eva Y Montalvo
*Assistant Examiner* — Mohammad M Hoque

(57) ABSTRACT

A semiconductor device and a method for manufacturing the same are disclosed, in which a buried gate region is formed, a nitride film spacer is formed at sidewalls of the buried gate region, and the spacer is etched in an active region in such a manner that the spacer remains in a device isolation region. Thus, if a void occurs in the device isolation region, the spacer can prevent a short-circuit from occurring between the device isolation region and its neighboring gates.

6 Claims, 10 Drawing Sheets

SEMICONDUCTOR DEVICE HAVING A BURIED GATE

CROSS-REFERENCE TO RELATED APPLICATION

The present application is a divisional of U.S. patent application Ser. No. 13/651,161 filed on Oct. 12, 2012, which claims priority of Korean Patent Application No. 10-2011-0147019 filed on 30 Dec. 2011, which are incorporated by reference in their entirety.

BACKGROUND OF THE INVENTION

Embodiments of the present invention relate to a semiconductor device and a method for manufacturing the same, which include a buried gate region, a nitride film spacer over sidewalls of the buried gate region, and a spacer in an active region etched in such a manner that a spacer remains in a device isolation region. As a result, even if a void occurs in the device isolation region, the spacer can prevent the occurrence of short-circuiting between the device isolation region and its neighboring gates.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs using a semiconductor property where electrical conductivity changes depending on the environment. The transistor has three regions, i.e., a gate, a source, and a drain. Electric charges move between the source and the drain according to a control signal inputted to the gate of the transistor. The movement of the electric charges between the source and the drain is achieved through a channel region.

When a general transistor is formed on a semiconductor substrate, a gate may be formed on the semiconductor substrate and impurities may be doped into both sides of the gate so as to form a source and a drain. As the data storage capacity of a semiconductor memory device has increased and the feature width thereof has decreased, the size of each unit cell must be gradually decreased. That is, the design rule of the capacitor and the transistor included in the unit cell has been reduced. Thus, as the channel length of a cell transistor is gradually decreased, the short channel effect, Drain Induced Barrier Lower (DIBL), etc. occur in the general transistor and thus operational reliability deteriorates. By maintaining a threshold voltage such that the cell transistor performs a normal operation, it is possible to solve the phenomena generated due to decreased channel length. In general, as the channel of the transistor shortens, the concentration of the impurities doped into a region in which the channel is formed may be increased.

However, if the concentration of the impurities doped into the channel region is increased while the design rule is reduced to 100 nm or less, the electric field of a Storage Node (SN) junction is increased, thereby lowering the refresh characteristics of the semiconductor memory device. In order to solve this problem, a cell transistor having a three-dimensional channel structure, in which the channel extends in a vertical direction, is so that the channel length of the cell transistor can be maintained even when the design rule is decreased. That is, even when a channel width in a horizontal direction is short, since the channel length of a vertical direction is secured, the impurity doping concentration may be reduced, thus preventing refresh characteristics from being lowered.

In addition, as the integration degree of the semiconductor device is increased, the distance between a word line coupled to a cell transistor and a bit line coupled to the cell transistor is gradually reduced. As a result, shortcomings may arise in which parasitic capacitance is increased such that an operation margin of a sense amplifier (sense-amp), which amplifies data transmitted via the bit line, is deteriorated. This negatively influences the operational reliability of the semiconductor device. In order to solve the above-mentioned shortcomings while simultaneously reducing parasitic capacitance between a bit line and a word line, a buried word line structure has been proposed recently in which a word line is formed only in a recess instead of an upper part of the semiconductor substrate. The buried word line structure includes a conductive material in a recess formed in a semiconductor substrate. An upper part of the conductive material is covered with an insulation film such that the word line is buried in a semiconductor substrate. As a result, the buried word line structure can be electrically isolated from a bit line formed over a semiconductor substrate including source/drain regions.

However, the buried word line (buried gate) structure has some disadvantages. First, Gate Induced Drain Leakage (GIDL) characteristics occur between a conductive material (gate electrode) and an N-type junction of an active region. Second, refresh characteristics of the whole semiconductor device deteriorate due to the GIDL characteristics.

FIG. 1 is a plan view illustrating a semiconductor device according to the related art.

Referring to FIG. 1, a device isolation region 120 defining an active region 110, and a buried gate 140 crossing the active region 110 are formed over a semiconductor device 100. In this case, the active region 110 is formed as an island type, a nitride seam 130 or void caused due to a poor gap-filling characteristic occurs in the device isolation region 120 between neighboring active regions 110. When depositing tungsten (W) to form a buried gate in a subsequent process, the seam 130 or void is filled with tungsten W, such that a bridge may occur between the buried gates 140 or an inter-cell leakage may also occur.

BRIEF SUMMARY OF THE INVENTION

Various embodiments of the present invention are directed to providing a semiconductor device and a method for manufacturing the same that substantially obviate one or more problems due to limitations and disadvantages of the related art.

Embodiments of the present invention relate to a semiconductor device and a method for manufacturing the same, which include a buried gate region and a nitride film spacer formed over sidewalls of the buried gate region. An embodiment may also include etching the spacer in an active region in such a manner that the spacer remains in a device isolation region. As a result, even if a void occurs in the device isolation region, the spacer can prevent the occurrence of short-circuiting between the device isolation region and its neighboring gates.

An embodiment of the present invention relates to a semiconductor device and a method for manufacturing the same, which form a buried gate region, form a nitride film spacer at sidewalls of the buried gate region, and etch the spacer of an active region in such a manner that a spacer remains on a device isolation region. Thus, although a void occurs in the device isolation region, the spacer can prevent the occurrence of short-circuiting between the device isolation and its neighbor gates.

In accordance with one aspect of the present invention, a method for manufacturing a semiconductor device includes forming a device isolation region defining an active region over a semiconductor substrate; forming a buried gate region by etching the active region and the device isolation region; forming a spacer at a sidewall of the buried gate region; forming a spacer pattern in the buried gate region of the device isolation region by etching the spacer using an etch mask exposing only the active region; and forming a buried gate by burying a conductive material in the buried gate region.

The spacer may include a nitride film or an oxide film.

The forming of the spacer pattern may include forming a photoresist film over an entire surface including the spacer at a sidewall of the buried gate region; forming a photoresist pattern by an exposure and development process using a mask exposing only the active region; and removing the spacer formed at a sidewall of the active region using the photoresist pattern as an etch mask.

The photoresist film may include a negative photoresist film.

The method may further include forming a gate oxide film at a time between the forming of the spacer pattern and the forming of the buried gate.

In accordance with another aspect of the present invention, a semiconductor device includes a device isolation region configured to define an active region over a semiconductor substrate; a buried gate region contained in the active region and the device isolation region; a spacer pattern formed at a sidewall of the buried gate region of the device isolation region; and a buried gate formed not only over the buried gate region but also over the spacer pattern.

The spacer pattern may include a nitride film or an oxide film.

The photoresist film may include a negative photoresist film.

The semiconductor device may further include a gate oxide film formed between the buried gate region and the buried gate.

It is to be understood that both the foregoing general description and the following detailed description of the present invention are exemplary and explanatory and are intended to provide further explanation of the invention as claimed.

In accordance with one aspect of the present invention, a method for manufacturing a semiconductor device includes defining a device isolation region between first and second active regions in a substrate; patterning the substrate to form a buried gate trench extending from the first active region through the device isolation region to the second active region; and forming a spacer pattern at a sidewall of the buried gate trench in the device isolation region.

The forming a spacer layer at the sidewall of the buried gate trench in the device isolation region and the first and the second active regions; and removing the spacer layer at the sidewall of the buried gate trench in the first and the second active regions to form the spacer pattern.

The performing a exposure and development process using a mask that selectively exposes the first and the second active regions.

The filling the buried gate trench in the device isolation region and the first and the second active regions with a conductive material to form a buried gate, wherein the spacer pattern is provided between the buried gate and the substrate in the device isolation region.

The forming a gate insulating film between the buried gate and the substrate in the first and the second active regions.

In accordance with another aspect of the present invention, a semiconductor device includes a device isolation region between first and second active regions in a substrate; a buried gate extending from the first active region through the device isolation region to the second active region; and a spacer pattern provided between the buried gate and the substrate in the device isolation region.

The spacer pattern does not extend (i) between the buried gate and the substrate in the first active region, and (ii) between the buried gate and the substrate in the second active region.

The buried gate is coupled to the substrate in the first active region or the substrate in the second active region.

The spacer pattern extends up to a level substantially as same as or higher than an upper surface of the buried gate.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
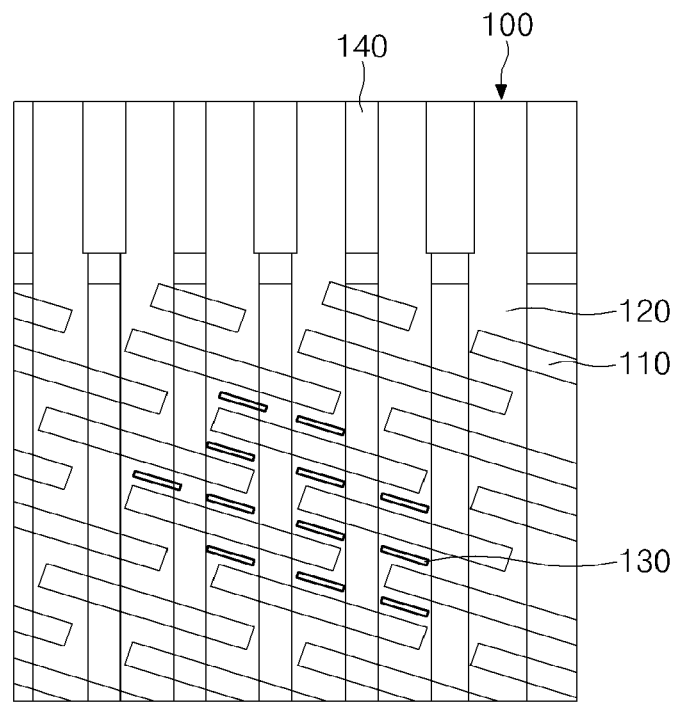
FIG. 1 is a plan view illustrating a semiconductor device according to the related art.
Figure 2:
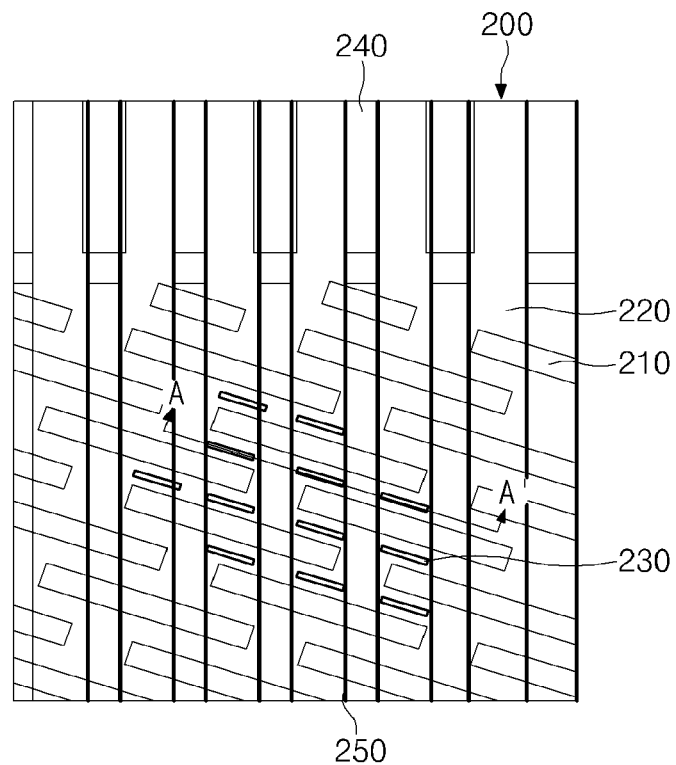
FIG. 2 is a plan view illustrating a semiconductor device and a method for manufacturing the same according to an embodiment of the present invention.

FIG. 2 is a plan view illustrating a semiconductor device and a method for manufacturing the same according to an embodiment of the present invention. Referring to FIG. 2, a device isolation region 220 defining an active region 210, and a buried gate 240 crossing the active region 210 are formed over a semiconductor substrate 200. The active region 210 is formed as an island type, a nitride seam or a void 230 is caused by a poor gap-filling characteristic in the device isolation region 220 between neighboring active regions 210. When tungsten (W) is deposited to form a buried gate in a subsequent process, the seam or the void 230 is filled with tungsten W. The tungsten in the seam or the void 230 forms a bridge between the buried gates 240, causing an inter-cell leakage. In order to solve the above-mentioned problems, in an embodiment of the present invention, a spacer 250 is formed at both sidewalls of the buried gate 240. Thus the spacer 250 may prevent the occurrence of a bridge between buried gates 240 formed in a subsequent process.

Figure 3:
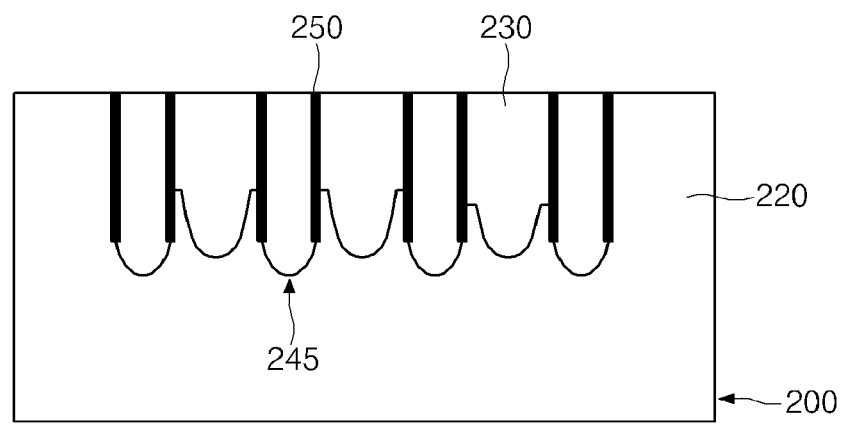
FIG. 3 is a cross-sectional view along the line A-A' of the semiconductor device shown in FIG. 2.

FIG. 3 is a cross-sectional view of the semiconductor device shown in FIG. 2 taken along the line A-A' of FIG. 2.

Referring to FIG. 3, a buried gate region 245 is formed by etching the semiconductor substrate 200. Preferably, the buried gate region 245 may be formed in a line type that crosses the active region 210.

Subsequently, a spacer 250 is formed at both sidewalls of the buried gate region 245. In an embodiment, the spacer 250 may be formed of a nitride film. The spacer 250 may prevent a bridge between neighboring gates 240 from forming through the seam or the void 230.

Figure 4:
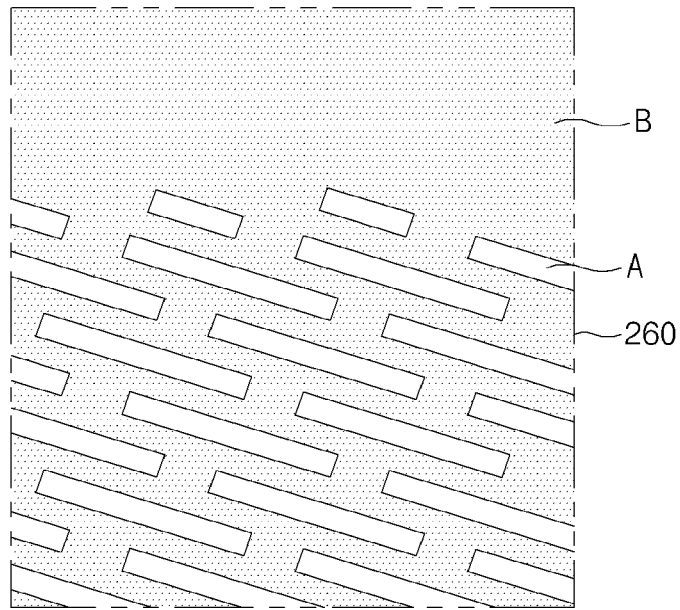
FIG. 4 is a mask employed to provide the semiconductor device shown in FIG. 2.
Figure 5:
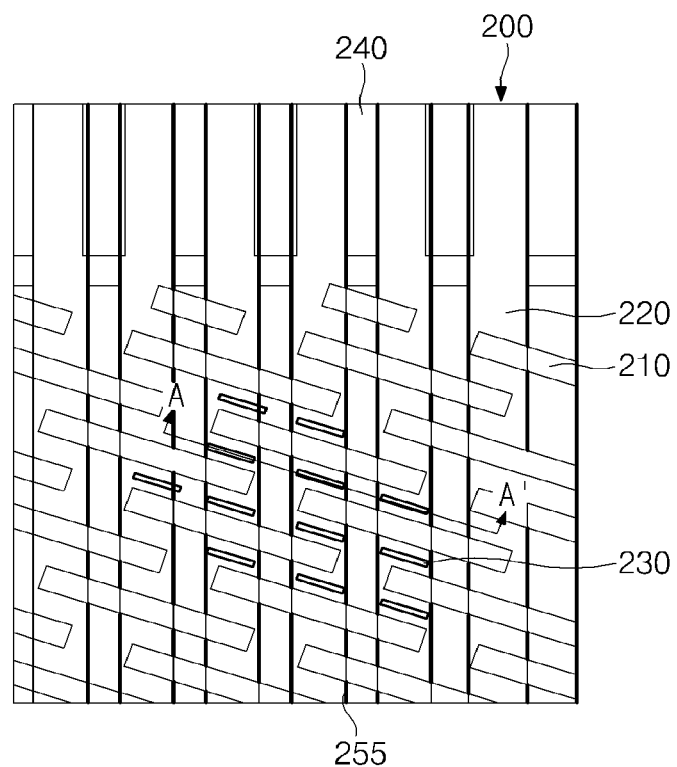
FIG. 5 is a plan view illustrating a semiconductor device obtained according to an embodiment of the present invention.

FIG. 4 is a mask semiconductor device. FIG. 5 is a cross-sectional view illustrating a semiconductor device that may be obtained by using the mask shown in FIG. 4.

Referring to FIGS. 4 and 5, in order to isolate the spacer 250 of FIG. 2, the spacer 250 (See FIG. 2) may be etched using an etch mask 260 including an open region (exposure region), denoted as 'A', and a closed region (shield region), denoted as 'B.' As a result, as shown in FIG. 5, a spacer pattern 255 remains only over sidewalls of the buried gate 240 in the device isolation region 220. The method for forming of the spacer pattern 255 includes forming a photoresist film over an entire surface including the spacer 250 over the sidewall of the buried gate region 245, forming a photoresist pattern by an exposure and development process using a mask that exposes only the active region 210 and removing the spacer 250 formed in the active region 210 using the photoresist pattern as an etch mask. The spacer pattern 255 extends up to a level substantially as same as or higher than an upper surface of the buried gate 240.

The open region (exposure region), denoted as 'A', may correspond to the active region 210 of FIG. 5. The closed region (shield region), denoted as 'B', may include all regions other than the active region.

Figure 6:
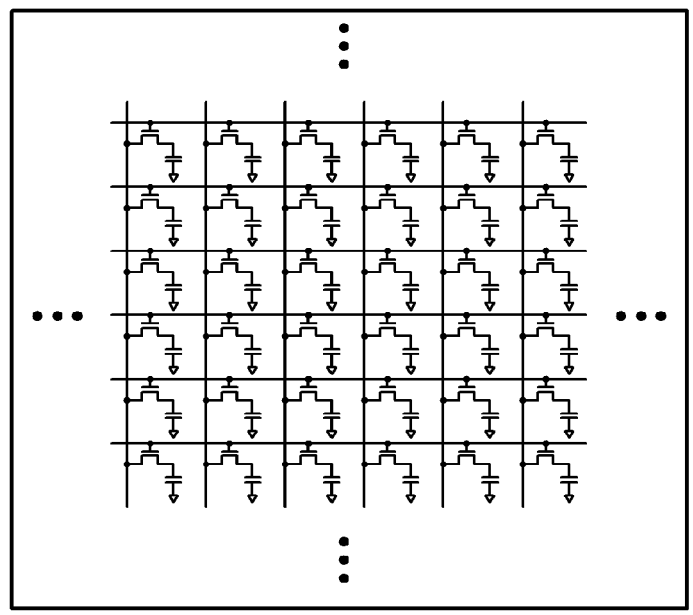
FIG. 6 is a block diagram illustrating a cell array according to embodiments of the present invention.

Referring to FIG. 6, the cell array includes a plurality of memory cells, and each memory cell includes one transistor and one capacitor. Such memory cells are located at intersections of bit lines BL1~BLn and word lines WL1~WLm. The memory cells may store or output data in response to a voltage applied to any bit line (BL1, . . . , BLn) or any word line (WL1, . . . , WLm) selected by a column decoder and a row decoder.

With respect to FIG. 6, a first direction (i.e., a bit-line direction) of the bit lines (BL1, . . . , BLn) of the cell array may be the horizontal direction, and a second direction (i.e., a word-line direction) of the word lines (WL1, . . . , WLm) may be the vertical direction, such that the bit lines (BL1, . . . , BLn) cross the word lines (WL1, . . . , WLm). A first terminal (for example, a drain terminal) of a transistor is coupled to a bit line (BL1, . . . , BLn), a second terminal (for example, a source terminal) thereof is coupled to a capacitor, and a third terminal thereof (for example, a gate terminal) is coupled to the a word line (WL1, . . . , WLm). A plurality of memory cells including the bit lines (BL1, . . . , BLn) and the word lines (WL1, . . . , WLm) may be located in a semiconductor cell array.

FIG. 6 is a block diagram illustrating a semiconductor device according to an embodiment of the present invention.

Figure 7:
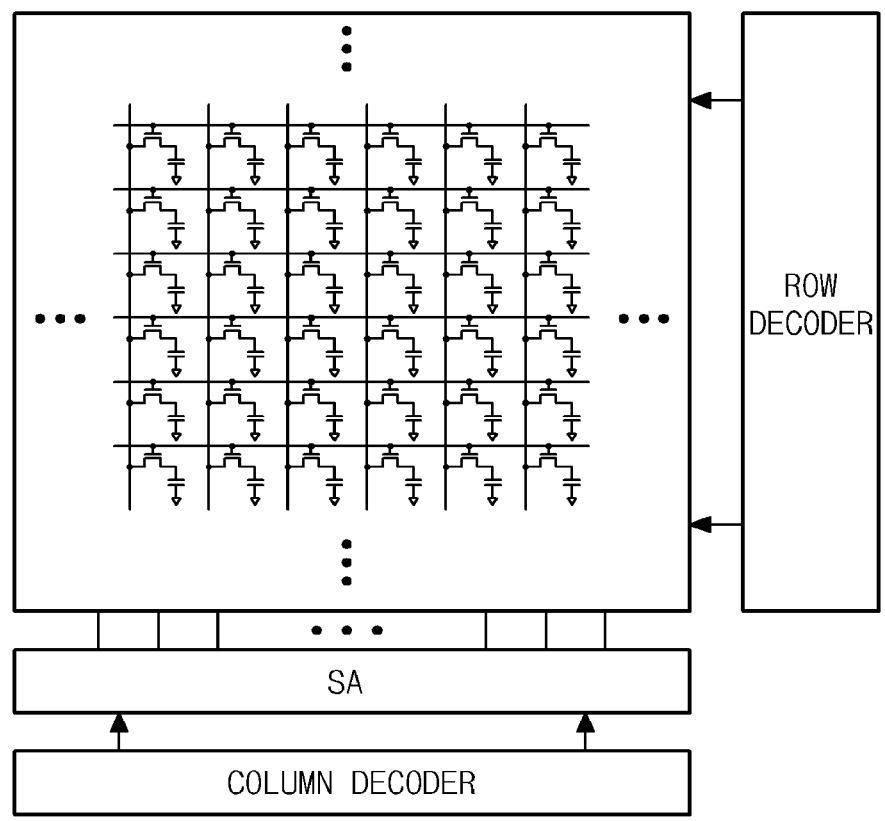
FIG. 7 is a block diagram illustrating a semiconductor device according to embodiments of the present invention.

Referring to FIG. 7, a semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal to the semiconductor cell array. In addition, the column decoder selects a bit line corresponding to a memory cell in which a read or write operation is to be performed from among a plurality of bit lines of the semiconductor cell array, and outputs a bit-line selection signal to the semiconductor cell array. The sense-amplifier (SA) may sense data stored in a memory cell selected by the row decoder and column decoder.

The semiconductor device may be coupled to a microprocessor or a memory controller. The semiconductor device may receive control signals such as WE*, RAS* and CAS* from the microprocessor, receive data through an input/output (I/O) circuit, and store the received data. The semiconductor device may be applied to a Dynamic Random Access Memory (DRAM), a P-Random Access Memory (P-RAM), an M-Random Access Memory (M-RAM), a NAND flash memory, a CMOS Image Sensor (CIS), and the like. Specifically, the semiconductor device may be applied to computers including a desktop, a laptop, or a server, and may also be applicable to a graphics memory and a mobile memory. A NAND flash memory is applicable not only to a variety of portable storage media (for example, a memory stick, a multimedia card (MMC), a secure digital (SD) card a compact flash (CF) card, an eXtreme Digital (XD) card, a universal serial bus (USB) flash drive, etc.), but also to a variety of digital applications (for example, MP3 players, PMPs, digital cameras, camcorders, memory cards, USB, game machines, navigation devices, laptops, desktop computers, mobile phones, and the like). A CMOS Image Sensor (CIS) is a charge coupled device (CCD) serving as an electronic film in digital devices, and is applicable to camera phones, Web cameras, small-sized medical imaging devices, etc.

Figure 8:
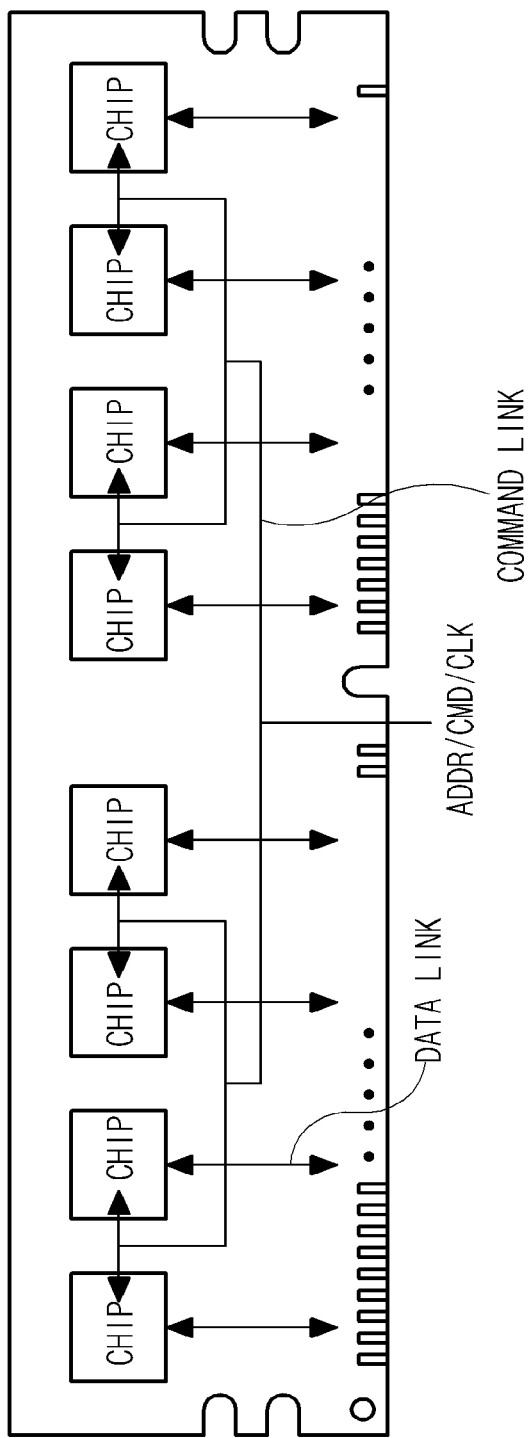
FIG. 8 is a block diagram illustrating a semiconductor module according to embodiments of the present invention.

FIG. 8 is a block diagram illustrating a semiconductor module according to an embodiment of the present invention.

Referring to FIG. 8, a semiconductor module includes a plurality of semiconductor devices mounted to a module substrate, a command link for enabling each semiconductor device to receive a control signal (address signal (ADDR)), a command signal (CMD), a clock signal (CLK) from an external controller (not shown), and a data link coupled to a semiconductor device so as to transmit data. The command link and the data link may be formed to be identical or similar to those of general semiconductor modules.

Although eight semiconductor chips are mounted to the front surface of the module substrate shown in FIG. 8, semiconductor chips may also be mounted to the back surface of the module substrate. That is, semiconductor chips can be mounted to one side or both sides of the module substrate, and the number of mounted semiconductor chips is not limited to that shown in FIG. 8. In addition, a material or structure of the module substrate is not limited to those of FIG. 8, and the module substrate may also be formed of other materials or structures.

Figure 9:
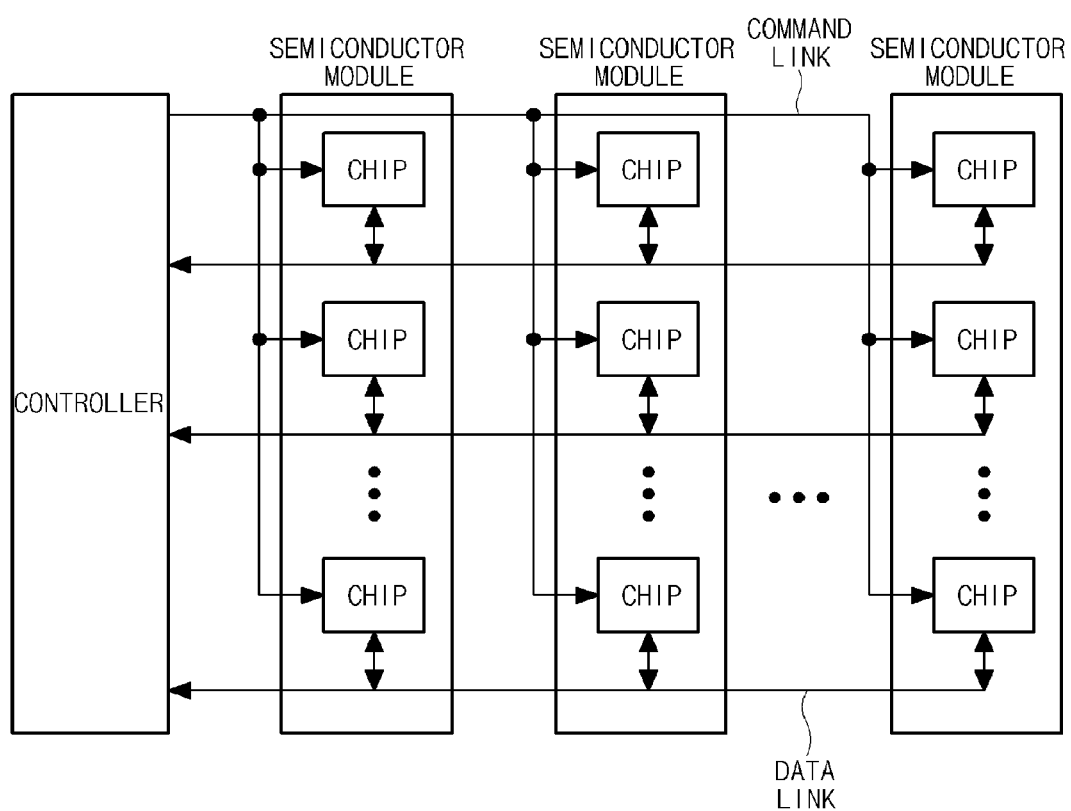
FIG. 9 is a block diagram illustrating a semiconductor system according to embodiments of the present invention.

FIG. 9 is a block diagram illustrating a semiconductor system according to an embodiment of the present invention.

Referring to FIG. 9, a semiconductor system includes at least one semiconductor module including a plurality of semiconductor chips, and a controller for providing a bidirectional interface between each semiconductor module and an external system (not shown) so as to control the operations of the semiconductor module. The controller may be identical or similar in function to a controller for controlling a plurality of semiconductor modules used in a general data processing system, and as such a detailed description thereof will be omitted herein. In an embodiment, the semiconductor module may be, for example, a semiconductor module shown in FIG. 8.

Figure 10:
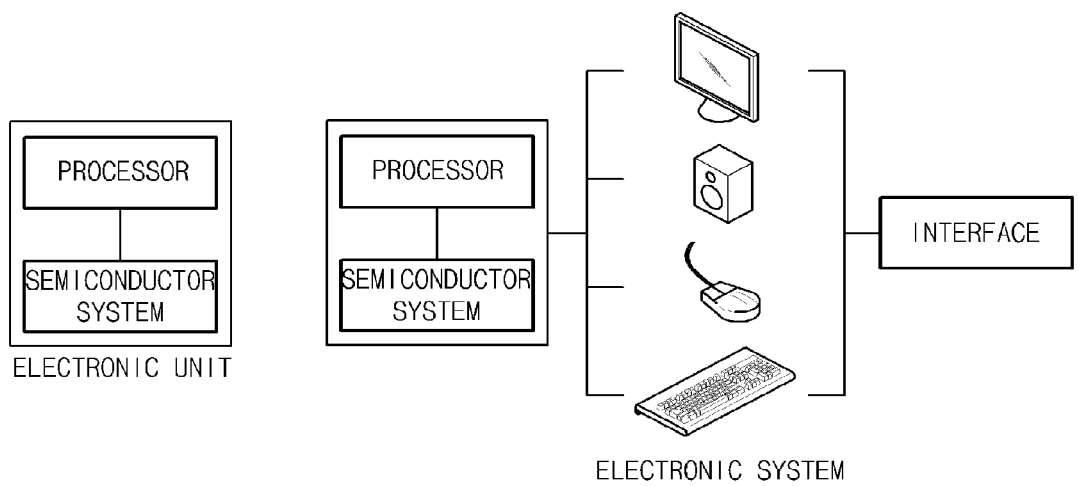
FIG. 10 is a block diagram illustrating an electronic unit and an electronic system according to embodiments of the present invention.

FIG. 10 is a block diagram illustrating an electronic unit and an electronic system according to an embodiment of the present invention. Referring to the diagram on the left of FIG.

10, the electronic unit includes an semiconductor system and a processor electrically coupled to the semiconductor system. The semiconductor system of FIG. 10 may be the same as that of FIG. 9. The processor may include a Central Processing Unit (CPU), a Micro Processor Unit (MPU), a Micro Controller Unit (MCU), a Graphics Processing Unit (GPU), and a Digital Signal Processor (DSP).

In this case, the CPU or MPU is configured in the form of a combination of an Arithmetic Logic Unit (ALU) serving as an arithmetic and logical operation unit and a Control Unit (CU) for controlling each unit by reading and interpreting a command. If the processor is a CPU or MPU, the electronic unit may include a computer or a mobile device. In addition, the GPU is used to calculate numbers having decimal points, and corresponds to a process for generating graphical data in real-time. If the processor is a GPU, the electronic unit may include a graphic device. In addition, DSP involves converting an analog signal (e.g., voice signal) into a digital signal at high speed, using the calculated result, re-converting the digital signal into an analog signal, and using the re-converted result. The DSP mainly calculates a digital value. If the processor is a DSP, the electronic unit may include a sound and imaging device.

The processor includes an Accelerate Calculation Unit (ACU), and is configured in the form of a CPU integrated into the GPU, such that it serves as a graphics card.

Referring to FIG. 10, the electronic system may include one or more interfaces electrically coupled to the electronic unit The interface may include a monitor, a keyboard, a printer, a pointing device (mouse), a USB, a switch, a card reader, a keypad, a dispenser, a phone, a display or a speaker. However, the scope of the interface is not limited thereto and is also applicable to other examples.

As apparent from the above description, the semiconductor device and a method for manufacturing the same according to embodiments of the present invention include a buried gate region, a spacer formed at sidewalls of the buried gate region. In an embodiment, the spacer may be etched in such a manner that a spacer remains in a device isolation region, but not in an active region. Thus, even if a void occurs in the device isolation region, the spacer can prevent a short-circuit between the device isolation region and its neighbor gates.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a device isolation region configured to define an active region of a semiconductor substrate;
    a buried gate region disposed in the active region and the device isolation region;
    a spacer pattern disposed on a sidewall of the buried gate region in the device isolation region; and
    a buried gate disposed over the buried gate region and over the spacer pattern,
    wherein the spacer pattern is disposed only in the device isolation region.

2. The semiconductor device according to claim 1, wherein the spacer pattern includes a nitride film or an oxide film.

3. A semiconductor device comprising:
    a device isolation region between first and second active regions in a substrate;
    a buried gate extending from the first active region through the device isolation region to the second active region; and
    a spacer pattern provided between the buried gate and the device isolation region,
    wherein the spacer pattern is disposed only in the device isolation region.

4. The semiconductor device of claim 3,
    wherein the spacer pattern does not extend (i) between the buried gate and the substrate in the first active region, and (ii) between the buried gate and the substrate in the second active region.

5. The semiconductor device of claim 3,
    wherein the buried gate is coupled to the substrate in the first active region or the substrate in the second active region.

6. The semiconductor device of claim 3,
    wherein the spacer pattern extends up to a level substantially as same as or higher than an upper surface of the buried gate.

* * * * *